(12) United States Patent
Kadow

(10) Patent No.: US 8,853,786 B1
(45) Date of Patent: Oct. 7, 2014

(54) SEMICONDUCTOR DEVICE WITH SWITCHING AND RECTIFIER CELLS

(71) Applicant: Infineon Technologies AG, Neubiberg (DE)

(72) Inventor: Christoph Kadow, Gauting (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/933,907

(22) Filed: Jul. 2, 2013

(51) Int. Cl.
*H01L 27/06* (2006.01)

(52) U.S. Cl.
CPC .................................. *H01L 27/0617* (2013.01)
USPC ........... 257/368; 257/334; 257/444; 257/427; 257/392; 257/E27.026

(58) Field of Classification Search
USPC .............. 257/7, 93, 334, 368, 427, 444, 446, 257/491, 663, 713
See application file for complete search history.

(56) References Cited

U.S. PATENT DOCUMENTS

| 6,501,110 | B1 * | 12/2002 | Mukai et al. .................. 257/256 |
| 2002/0000795 | A1 * | 1/2002 | Wittenbreder, Jr. ........... 323/271 |
| 2007/0230228 | A1 * | 10/2007 | Mao ............................... 363/89 |
| 2008/0252145 | A1 * | 10/2008 | Urakabe et al. ................. 307/75 |

FOREIGN PATENT DOCUMENTS

DE    102009018054 A1    11/2010

OTHER PUBLICATIONS

Weis et al. "Integrated Switching Device with Parallel Rectifier Element." U.S. Appl. No. 13/441,038, filed Apr. 6, 2012.

* cited by examiner

*Primary Examiner* — Mamadou Diallo
(74) *Attorney, Agent, or Firm* — Murphy, Bilak & Homiller, PLLC

(57) ABSTRACT

A semiconductor device includes a semiconductor switching element and a rectifier element. The semiconductor switching element includes a plurality of switching cells connected in parallel between a first and a second load terminal and is formed in a cell area of a first semiconductor layer. The rectifier element includes a plurality of rectifier cells connected in parallel between the first load terminal and an auxiliary terminal. The rectifier cells are formed in a second semiconductor layer parallel to the first semiconductor layer in a vertical projection of the cell area. The semiconductor device may integrate free-wheeling diodes for inductive loads and semiconductor switching elements for switching the inductive loads.

19 Claims, 9 Drawing Sheets

SEMICONDUCTOR DEVICE WITH SWITCHING AND RECTIFIER CELLS

BACKGROUND

Power semiconductor devices may switch inductive loads. The inductive load provokes an off-state current flowing through the switching device or a clamping diode until the energy stored in the inductive load has been dissipated. It is desirable to provide improved semiconductor devices for switching inductive loads.

SUMMARY

An embodiment concerns a semiconductor device including a semiconductor switching element and a rectifier element. The semiconductor switching element includes a plurality of switching cells connected in parallel between a first and a second load terminal and formed in a cell area of a first semiconductor layer. The rectifier element comprises a plurality of rectifier cells connected in parallel between the first load terminal and an auxiliary terminal. The rectifier cells are formed in a second semiconductor layer parallel to the first semiconductor layer and in a vertical projection of the cell area.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

Figure 1A:
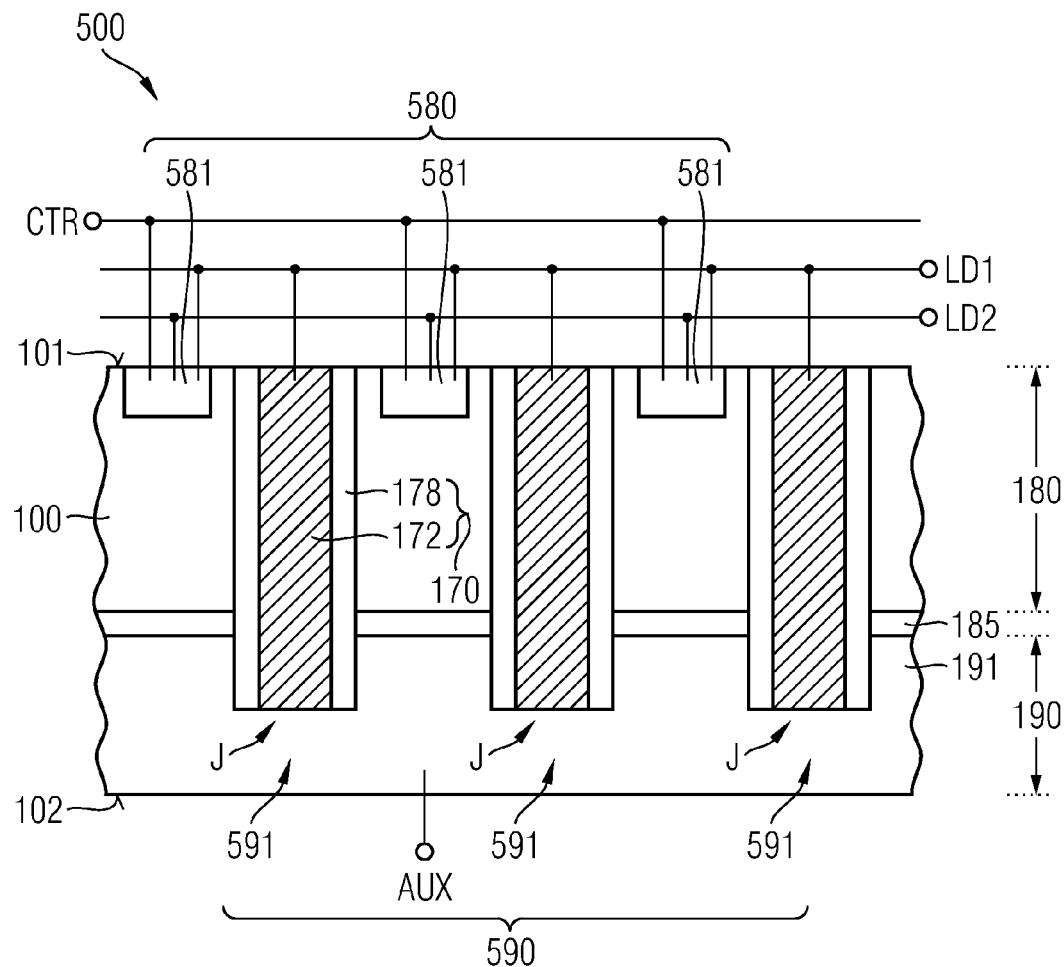
FIG. 1A is a schematic cross-sectional view of a portion of a semiconductor device with semiconductor switching elements and rectifier elements according to an embodiment.
Figure 1B:
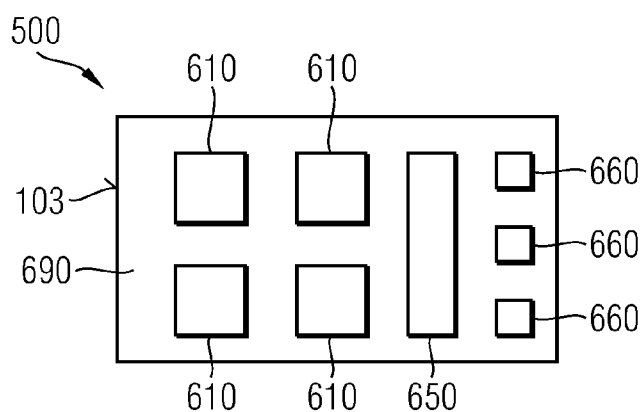
FIG. 1B is a schematic plan view of the semiconductor device of FIG. 1A according to an embodiment.

FIGS. 1A and 1B refer to a semiconductor device 500 integrating a plurality of switching cells 581 of a semiconductor switching element 580 and a plurality of rectifier cells 591 of a rectifier element 590 in a semiconductor portion 100 that includes a first semiconductor layer 180 and a second semiconductor layer 190 oriented parallel to the first semiconductor layer 180. A surface of the first semiconductor layer 180 opposite to the second semiconductor layer 190 forms a first surface 101 of the semiconductor portion 100 and a surface of the second semiconductor layer 190 opposite to the first semiconductor layer 180 forms a second surface 102 of the semiconductor portion 100, wherein the first and second surfaces 101, 102 are parallel to each other.

A normal to the first surface 101 defines a vertical direction and directions parallel to the first and second surfaces 101, 102 and orthogonal to the vertical direction are lateral directions.

The first and second semiconductor layers 180, 190 are provided from the same or different single-crystalline semiconductor material(s) including silicon Si, silicon carbide SiC, germanium Ge, a silicon germanium crystal SiGe, gallium nitride GaN and gallium arsenide GaAs by way of example.

A separation layer 185 may separate the first and second semiconductor layers 180, 190. The separation layer 185 may be an insulator layer provided from one or more dielectric materials. For example the separation layer 185 may consist of or include a semiconductor oxide, for example silicon oxide or a silicon glass. According to other embodiments, the separation layer 185 consists of or includes a single crystalline semiconductor layer, for example an intrinsic or doped semiconductor layer.

The semiconductor portion 100 may be obtained from a semiconductor wafer, for example a single crystalline silicon wafer. According to other embodiments at least portions of the first and second semiconductor layers 180, 190 and/or the separation layer 185 are grown by epitaxy on a single crystalline substrate layer, which may be part of the first or second semiconductor layers 180, 190. Other embodiments may provide the semiconductor portion 100 from an SOI (silicon-on-insulator) wafer, for example from an SOG (silicon-on-glass) wafer, wherein the separation layer 185 may consist of or include the insulator or glass substrate of the SOI or SOG wafer.

The illustrated portion of the semiconductor device 500 refers to a cell area comprising a plurality of substantially identical switching cells 581 which are connected in parallel between a first and a second load terminal LD1, LD2, wherein the first load terminal LD1 may be provided to be connected to a terminal of an inductive load and the second load terminal LD2 is provided to be connected to a DC supply voltage.

As shown in FIG. 1B, the semiconductor device 500 may include one or more spatially separated cell areas 610 with substantially identical rectifier cells and substantially identical semiconductor switching cells. The cell areas 610 are typically spaced from an outer surface 103 connecting the first and second surfaces 101, 102 of the semiconductor portion 100. The semiconductor device 500 may include further intrinsic zones, impurity zones, conductive and dielectric structures and further integrated electronic circuits 650, such as diodes, drivers, sensors and boost circuits for voltage conversion. The semiconductor device 500 may further include contact structures 660, e.g. contact pads, on the first and second surfaces 101, 102. The contact structures 660 may be effective as terminals or may form bases for bond wires between the semiconductor portion 100 and wire terminals. The terminals include the first and second load terminals LD1, LD2, a control terminal CTR for supplying a control signal for the switching element and an auxiliary terminal AUX for supplying a DC supply voltage complementary to that applied to the second load terminal LD2.

A first one of the contact structures 660 may embody or may be electrically connected or electrically coupled to the first load terminal LD1. A second one of the contact structures 660 may embody or may be electrically connected or electrically coupled to the second load terminal LD2. The first contact structure 660 assigned to the first load terminal LD1 and the second contact structure 660 assigned to the second load terminal LD2 may be provided at the same side of the semiconductor device 500, for example at the side defined by the first surface 101.

Referring again to FIG. 1A, the semiconductor device 500 may be a power switching device, e.g. a power MISFET (metal insulator semiconductor field effect transistor) in the conventional meaning including FETs with gate electrodes provided from metal and/or semiconductor materials, an IGBT (insulated gate bipolar transistor), a JFET (junction field effect transistor), a bipolar transistor or a thyristor. The switching cells 581 may be enhancement or depletion IGFET (insulated gate field effect transistor) cells, for example MISFET cells. The switching cells 581 may be lateral cells employing a lateral channel or may be vertical cells employing a vertical channel. Control inputs of the semiconductor switching elements 581 are connected to each other and to the control terminal CTR of the semiconductor device 500. Impurity zones of the semiconductor switching cells 581 are provided or formed in the first semiconductor layer 180.

The rectifier cells 591 are formed in the second semiconductor layer 190 in a region in the vertical projection of the cell area 610 and are spatially separated from each other. The vertical projections of the rectifier cells 591 into the first semiconductor layer 180 are interspersed among the switching cells 581. For example, the switching and rectifier cells 581, 591 are arranged alternately along one or two orthogonal directions perpendicular to the vertical direction with m rectifier cells 591 for each n switching cells 581, m and n being natural numbers greater 0. For example, two switching cells 581 may alternate with one rectifier cell 591 along at least one lateral direction.

According to an embodiment, the switching and rectifier cells 581, 591 are stripe structures extending along a first lateral direction and the switching and rectifier cells 581, 591 alternate along a second lateral direction perpendicular to the first lateral direction. According to another embodiment, the lateral cross sections of the switching and rectifier cells 581, 591 are rectangular, for example squares with or without rounded corners, ovals or ellipses and the semiconductor switching and rectifier cells 581, 591 are arranged along two orthogonal lateral directions, wherein the repetition pattern may be the same or may differ along both lateral directions. The rectifier cells 591 include junctions J, e.g. Schottky junctions or pn junctions, with a main impurity zone 191 providing a first rectifier electrode formed in the second semiconductor layer 190.

The separation layer 185 separates the main impurity zone 191 from the first semiconductor layer 180 by a dielectric structure or one or two further pn junction(s).

According to an embodiment, connection channels 170 extend from the first surface 101 through the first semiconductor layer 180 into the second semiconductor layer 190 and into the main impurity zone 191 formed in the second semiconductor layer 190. The connection channels 170 include a conductive core portion 172 and an insulating portion 178 that dielectrically separates the conductive core portion 172 from at least sections of the first semiconductor layer 180 in the lateral directions. The pn or Schottky junction J of each rectifier cell 591 is directly or indirectly formed between the conductive core portion 172 and the main impurity zone 191.

The insulating portion 178 may include one or more dielectric layers from one or more different materials. According to an embodiment the insulating portion 178 includes a semiconductor oxide layer directly adjoining the semiconductor material of the first semiconductor layer 180. Other embodiments may include a deposited semiconductor oxide layer, for example a silicon oxide layer provided by using TEOS (tetra ethyl ortho silane) as precursor, silicon nitride or other insulating nitrides and oxides. The core portion 172 may be provided from one or more layers of conductive materials, for example heavily doped polycrystalline silicon, or layers comprising tungsten W, titanium Ti or tantalum Ta as main constituent(s).

According to an embodiment related to Schottky junctions, the core portion 172 includes a structure from a suitable Schottky material at least at the buried end faces of the connection channels 170. Schottky materials may be metals like tungsten W or platinum Pt, or metal compounds, e.g. refractory metal silicides like TiSi, PtSi, TaSi or other metal compounds with tungsten W, titanium Ti, tantalum Ta, or platinum as one of the main constituents. The core portion 172 may include one or more fill materials between the first surface 101 and the Schottky material.

According to embodiments related to pn junctions, buried implant zones may be formed in the vertical projection of the connection channels 170, wherein the buried implant zones have the opposite conductivity type of the main impurity zone 191, and wherein the buried implant zones of neighboring rectifier cells 591 are spatially separated from each other in the lateral direction.

The main impurity zone 191 in the second semiconductor layer 190 forms a common first rectifier electrode of the rectifier elements 591 and is electrically connected or coupled to the auxiliary terminal AUX. The auxiliary terminal AUX may be a contiguous electrode structure provided at the second surface 102 or may be electrically connected to a support pad on the first surface 101. Corresponding second rectifier electrodes of the rectifier cells 591 are spatially separated from each other, electrically connected to each other and may be electrically connected or electrically coupled to the first load terminal LD1. The first load terminal LD1 may be a contact pad formed at the first surface 101.

The semiconductor device 500 integrates the semiconductor switching element 580 and the rectifier element 590 in different layers such that both elements use the same chip area for layout and current flow. In both high and low side configurations, either a load current flows through the load path of the semiconductor switching element 580 or a free wheeling current flows through the rectifier element 590 such that the thermal strain is uniformly distributed over the chip area both in time and in space.

In approaches dissipating inductive energy from a switched inductive load in a semiconductor switching element, the switching element is subject to certain design constrictions resulting from making the semiconductor device sufficiently robust for dissipating the inductive energy. Such approaches typically provide high energy-dissipating abilities, for example they involve the use of copper electrodes or provide greater chip areas. Instead, the semiconductor switching element 580 according to the present embodiments can be designed without such constraints because the thermal energy is dissipated by the rectifier element 590. On the other hand, integration of the free wheeling diode into the semiconductor device 100 simplifies the design of circuit boards, extends the range of applications for the semiconductor device 500 and enhances device parameters.

Figure 2A:
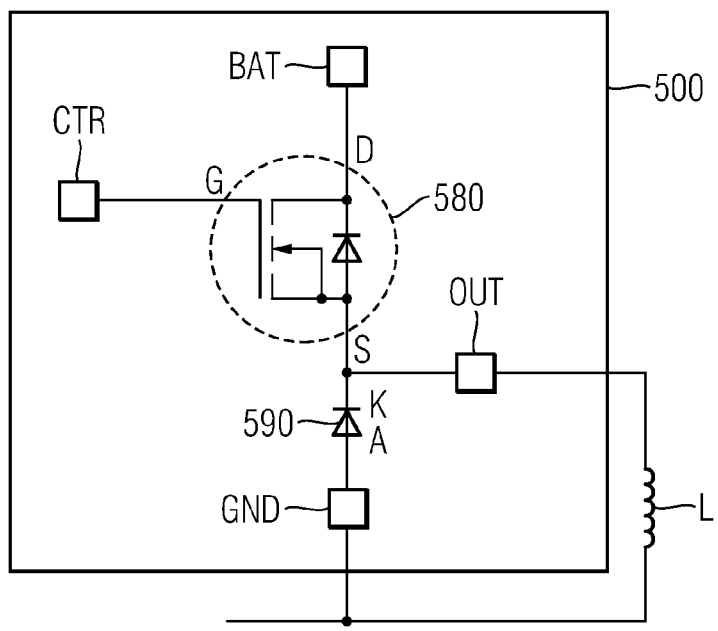
FIG. 2A is a schematic circuit diagram with a semiconductor device with n-FET cells and an inductive load in a high side configuration.
Figure 2B:
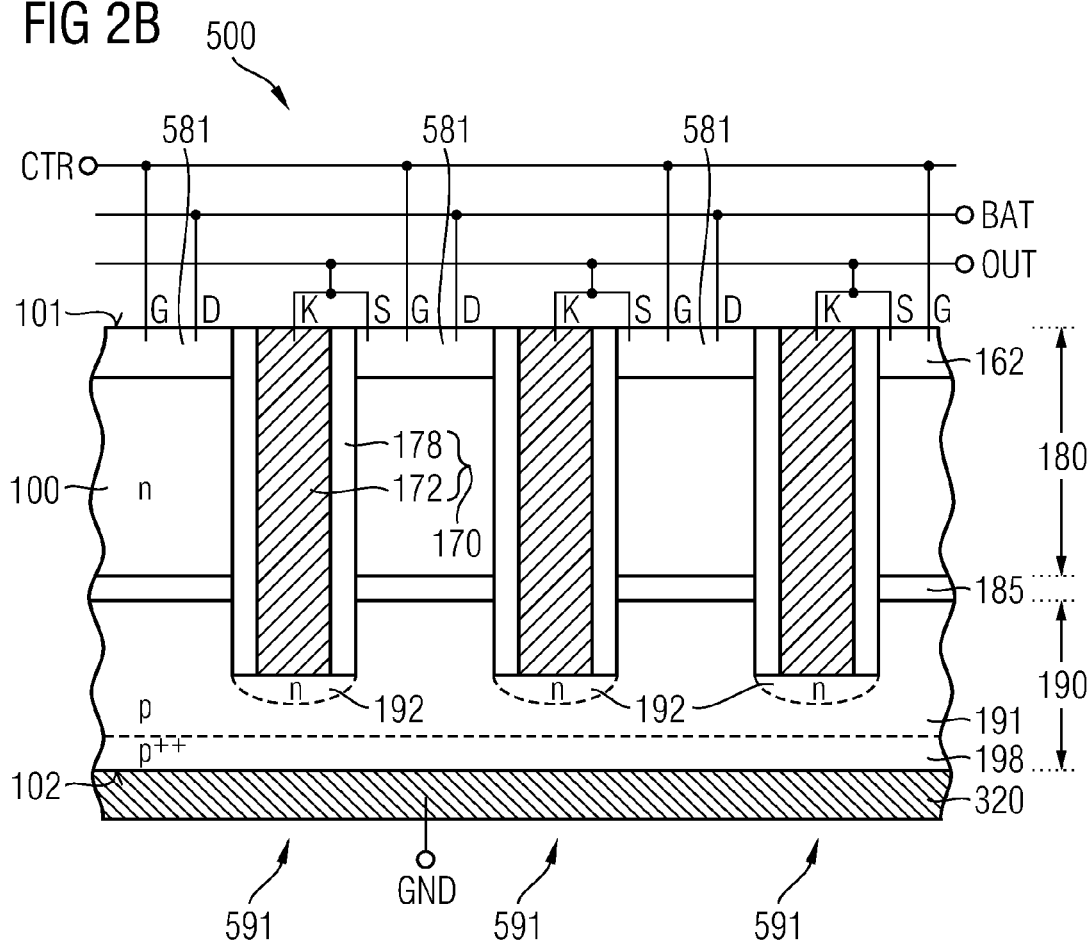
FIG. 2B is a schematic cross-sectional view of a portion of the semiconductor device of FIG. 2A.

FIGS. 2A and 2B relate to an embodiment of a semiconductor device 500 based on n-channel IGFET cells in a high side configuration. A load path of the semiconductor device 500 including the drain-source path of the switching element 580 is arranged in series with an inductive load L. In the high side configuration, the drain D of the switching element 580, which may be an n-IGFET, is connected to a positive supply voltage and the source S is connected to a first terminal of the inductive load L whose second terminal may be connected to a negative supply voltage, e.g. a ground node.

The rectifier element 590 used as a free wheeling diode for the inductive load L is arranged in parallel with the inductive load L between the source S of the switching element 580 and the negative supply voltage. Accordingly, as regards the terminals LD1, LD2, AUX of FIG. 1A, for the high side configuration a first load terminal LD1 connected to both the switching element 580 and the rectifier element 590 corresponds to an output terminal OUT for connection with the first terminal of the inductive load, the second load terminal LD2 corresponds to a terminal BAT for connection with a positive supply voltage, and the auxiliary terminal AUX corresponds to a ground terminal GND for connection with a negative supply voltage.

The rectifier element 590 is arranged between the output terminal OUT and the ground terminal GND with the anode A connected to the ground terminal GND and the cathode K connected to the source S of the semiconductor switching element 580. In addition, the semiconductor device 500 includes a control terminal CTR for controlling the potential at a gate electrode G of the semiconductor switching element 580.

FIG. 2B illustrates a cross-sectional view of a portion of the semiconductor device 500 based on n-IGFET cells for the high side configuration of FIG. 2A. The semiconductor portion 100 includes a first semiconductor layer 180, a second semiconductor layer 190 parallel to the first semiconductor layer 180 and a separation layer 185 between the first and second semiconductor layers 180, 190. A main impurity zone 191 in the second semiconductor layer 190 is p-doped and forms a common anode electrode of a plurality of rectifier cells 591. A heavily doped impurity layer 198 of the same conductivity type as the main impurity zone 191 electrically connects the main impurity zone 191 with a rear electrode structure 320 that forms the ground terminal GND or that is electrically connected to the ground terminal GND of the semiconductor device 500.

N doped buried implant zones 192 directly adjoining connection channels 170 in the second semiconductor layer 190 form cathode regions spatially separated by portions of the main impurity zone 191. Conductive core portions 172 of the conduction channels 170 electrically connect the buried cathode regions with a conductive structure on the first surface 101. The conductive structure is electrically connected to source zones of n-IGFET cells providing the switching cells 581 and to the output terminal OUT that is electrically connected to both the source zones and the spatially separated cathode regions of the rectifier cells 591. An insulation portion 178 dielectrically insulates the core portion 172 from at least some or all of the impurity zones formed in the first and second semiconductor layers 180, 190.

The switching cells 581 may be n-IGFET cells with lateral or vertical channels controlled in a depletion mode or an enhancement mode. The battery terminal BAT is electrically connected to drain zones of the n-IGFET cells. The control terminal CTR is electrically connected to gate electrodes G of the switching cells 581.

Figure 3A:
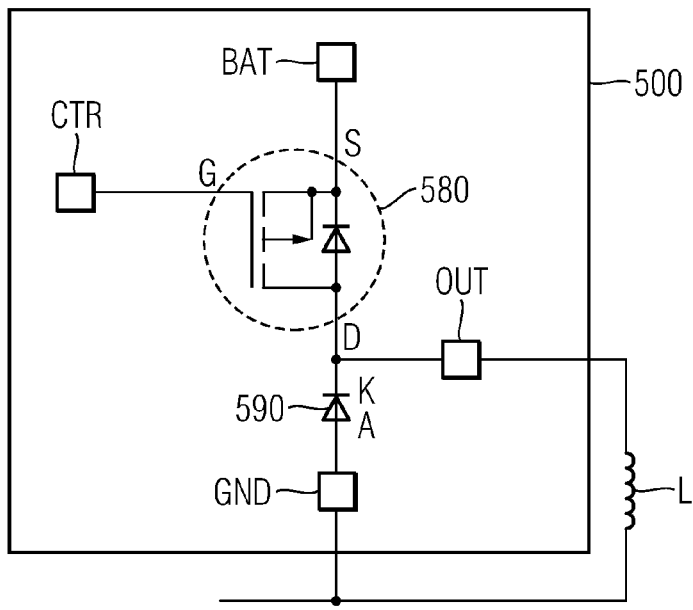
FIG. 3A is a schematic circuit diagram with a semiconductor device with p-FET cells and an inductive load in a high side configuration.
Figure 3B:
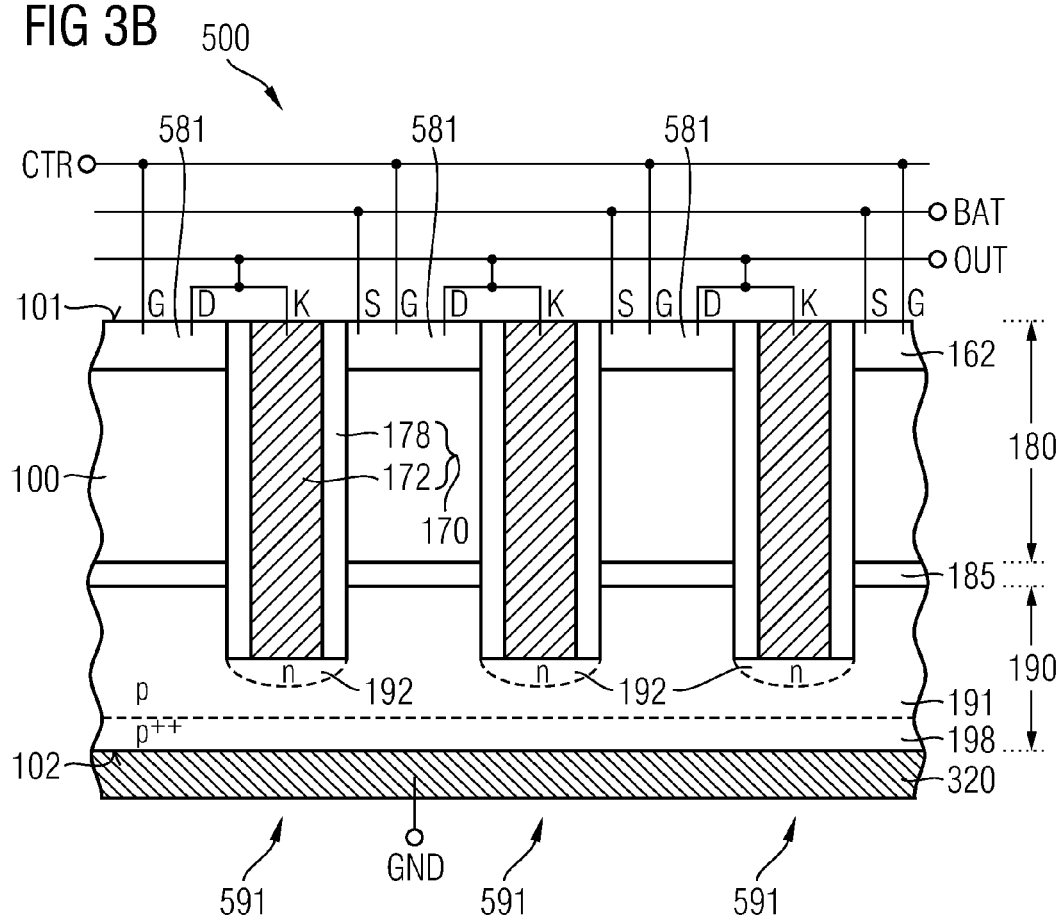
FIG. 3B is a schematic cross-sectional view of a portion of the semiconductor device of FIG. 2A.

FIGS. 3A and 3B relate to an embodiment of a semiconductor device 500 based on p-channel IGFET cells in a high-side configuration. The source-drain path of a switching element 580 is arranged in series with an inductive load L. The source of the switching element 580 is connected to a positive supply voltage and the drain D is connected to a first terminal of the inductive load L whose second terminal may be connected to a negative supply voltage, e.g. a ground node. A rectifier element 590 is arranged in parallel with the inductive load L between the drain D of the switching element 580 and the negative supply voltage.

The anode A of the rectifier element 590 is electrically connected to the ground terminal GND and the cathode K is connected with the drain D of the semiconductor switching element 580.

FIG. 3B in substance corresponds to FIG. 2B. Other than the n-IGFET cells of FIG. 2B, the p-IGFET cells of FIG. 3B provide a switching element 580 whose drain D is electrically connected with the cathode K of the rectifier element 590, whereas the source S is electrically connected with the terminal BAT for connection with the positive supply voltage.

Figure 4A:
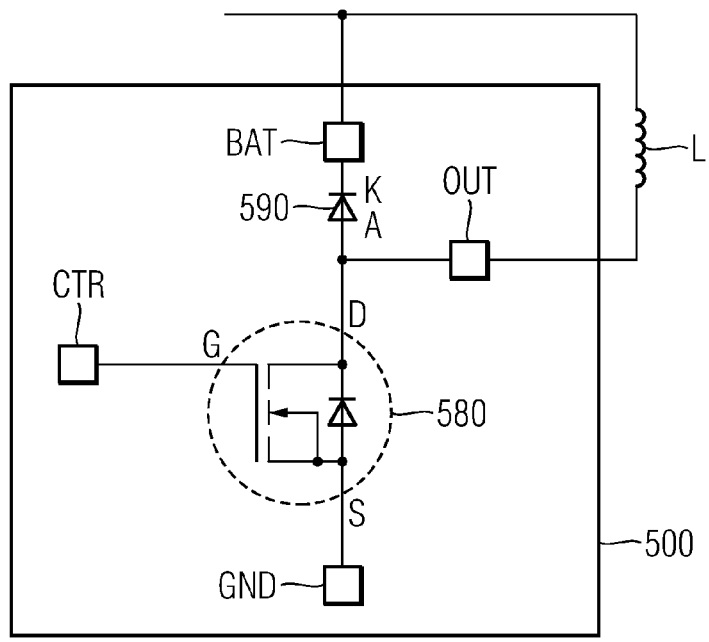
FIG. 4A is a schematic circuit diagram with a semiconductor device with n-FET cells and an inductive load in a low side configuration.
Figure 4B:
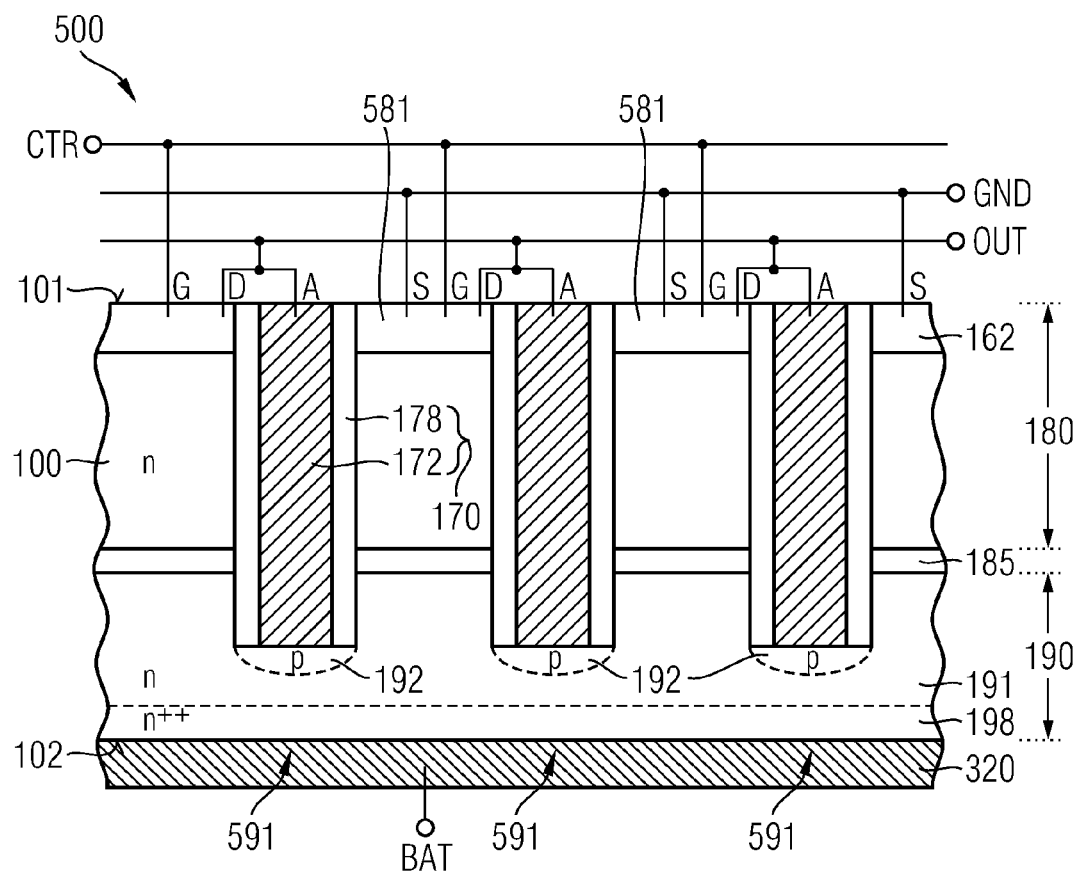
FIG. 4B is a schematic cross-sectional view of a portion of the semiconductor device of FIG. 4A.

FIGS. 4A and 4B relate to an embodiment of a semiconductor device 500 in a low side configuration. A load path including the drain-source path of the switching element 580 is arranged in series with an inductive load L. In the low side configuration the source S of the switching element 580 is connected to a negative supply voltage and the drain D is connected to a first terminal of the inductive load L whose second terminal may be electrically connected with a positive supply voltage. The rectifier element 590, which is effective as a free-wheeling diode of the inductive load L, is arranged in parallel with the inductive load L between the drain D of the switching element 580 and the positive potential. As regards the terminals LD1, LD2, AUX of FIG. 1A, for the low side configuration the first load terminal LD1 connected to both the switching element 580 and the rectifier element 590 corresponds to an output terminal OUT for connection with the first terminal of the inductive load, the second load terminal LD2 corresponds to a terminal GND for connection with a negative supply voltage, for example the ground potential, and the auxiliary terminal AUX corresponds to a terminal BAT for connection with a positive supply voltage.

As illustrated in FIG. 4B, source zones S of the switching cells 581 are electrically connected to a ground terminal GND and gate electrodes G are electrically connected to a control terminal CTR. According to an embodiment, the main impurity zone 191 in the second semiconductor layer 190 may be n-doped and may form a common cathode region of the rectifier cells 591, wherein the common cathode region is electrically connected or coupled to the battery terminal BAT. P-doped buried implant zones 192 directly adjoining the connection channels 170 in the second semiconductor layer 190 may form anode regions which are spatially separated by portions of the main impurity zone 191 and which are electrically connected with the drains D of the switching cells 581 and the output terminal OUT. The switching cells 581 may be n-IGFET cells with lateral or vertical channels provided for the depletion or the enhancement mode.

Figure 5A:
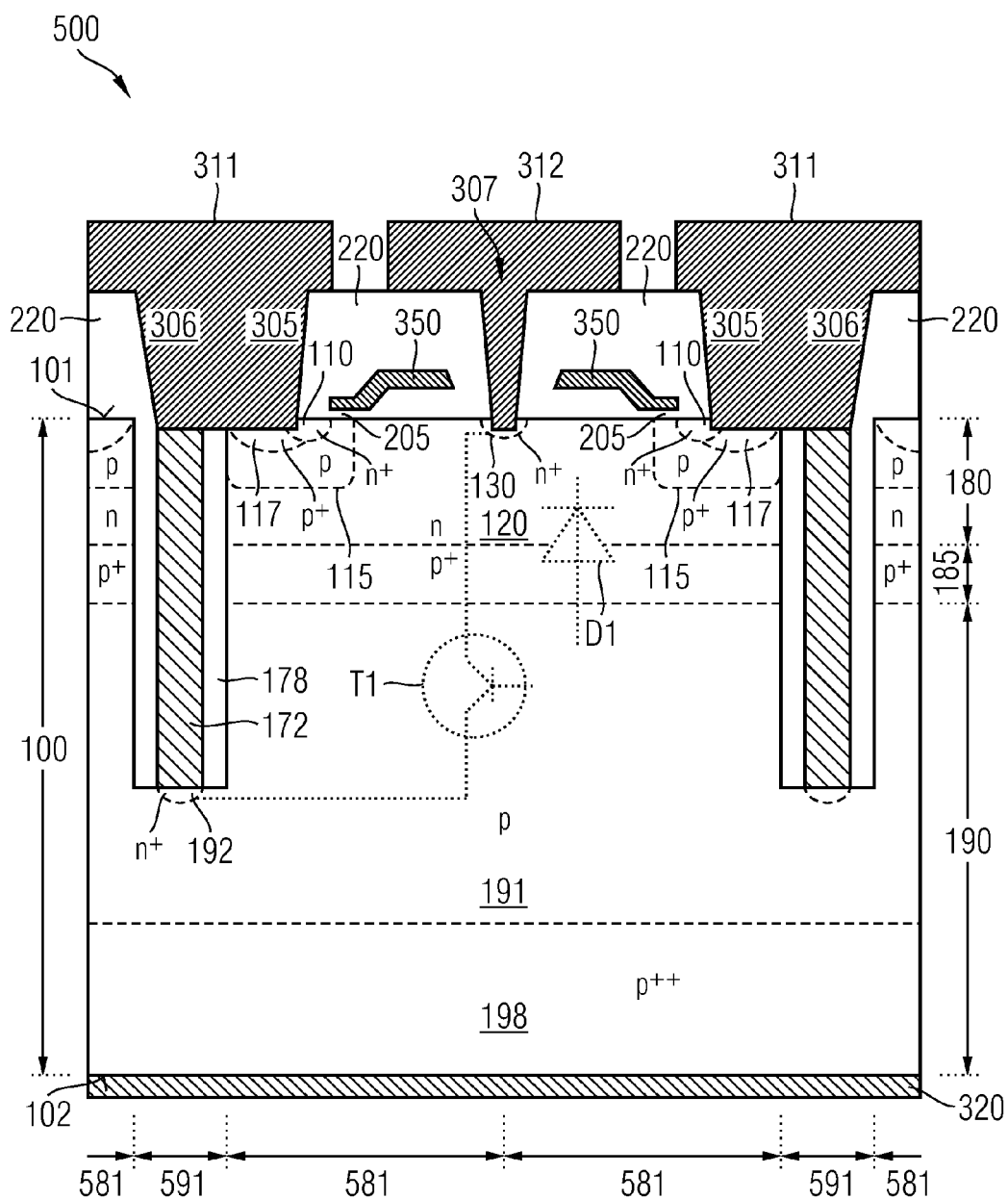
FIG. 5A is a schematic cross-sectional view of a portion of a semiconductor device according to an embodiment providing lateral n-FET cells and rectifier cells based on pn junctions.

FIG. 5A is related to an embodiment providing lateral n-IGFET cells of the enhancement type.

The semiconductor device 500 may be a power switching device with a semiconductor portion 100 including a first semiconductor layer 180 and a second semiconductor layer 190 parallel to the first semiconductor layer 180. At a wiring side of the semiconductor portion 100 the first semiconductor layer 180 forms a first surface 101. On an opposite rear side, the second semiconductor layer 190 forms a second surface 102 of the semiconductor portion 100 parallel to the first surface 101. Each of the first and second semiconductor layers 180, 190 are provided from a single-crystalline semiconductor material, for example silicon Si, silicon carbide SiC, germanium Ge, a silicon germanium crystal SiGe, gallium nitride GaN or gallium arsenide GaAs. The first and second semiconductor layers 180, 190 may be provided from the same single-crystalline semiconductor material or from different single-crystalline semiconductor materials.

A distance between the first and second surfaces 101, 102 may be at least 40 μm, for example at least 175 μm. The semiconductor portion 100 may have a rectangular shape with an edge length in the range of several millimeters or a circular shape with a diameter of several millimeters. A normal to the first and second surfaces 101, 102 defines a vertical direction and directions orthogonal to the normal direction are lateral directions.

In a cell area of the first semiconductor layer 180 lateral IGFET cells provide switching cells 581 of a semiconductor switching element 580. The switching cells 581 may be arranged in pairs sharing a common impurity zone. In the illustrated embodiment, two neighboring switching cells 581 share a common drain zone 130. The shared drain zone 130 has a first conductivity type and may be formed as a well directly adjoining the first surface 101.

An impurity concentration in the drain zone 130 may be comparatively high, i.e. at least $5 \times 10^{18}$ cm$^{-3}$. The common drain zone 130 may be a stripe extending along a lateral direction orthogonal to the cross-sectional plane. Pairs of the switching cells 581 may be symmetric with regard to a lateral center axis of the common drain zone 130 perpendicular to the cross-sectional plane. At a distance to the common drain zone 130, source zones 110 of the first conductivity type may directly adjoin the first surface 101 and are formed as wells extending from the first surface 101 into a body zone 115 of a second, complementary conductivity type. The body and the common drain zones 115, 130 are formed as wells in a drift layer 120. Outside the body and common drain zones 115, 130 the drift layer 120 has the first conductivity type. An interface between the drift layer 120 and a separation layer 185 separating the first and second semiconductor layers 180, 190 is parallel to the first and second surfaces 101, 102. A mean net impurity concentration in the drift layer 120 may be between $10^{12}$ cm$^{-3}$ and $10^{16}$ cm$^{-3}$, by way of example.

Gate dielectrics 205, e.g. silicon oxide, silicon nitride, alumina or hafnium oxide, may be provided at least in sections of the first surface 101 where the body zones 115 directly adjoin the first surface 101. The gate dielectrics 205 dielectrically insulate the body zones 115 from conductive gate electrodes 350. The gate electrodes 350 may be provided from one or more conductive material(s) such as heavily doped polycrystalline silicon (polysilicon), a metal, for example Al, Cu, a metal alloy like AlSi, AlCu and AlSiCu, a metal silicide e.g. TiSi, TaSi, PtSi or another metal compound like TiW.

In the vertical projection of the cell area, the second semiconductor layer 190 includes rectifier cells 591 interposed with the switching cells 581. Each of the spatially separated rectifier cells 590 includes a semiconductor junction, for example a pn junction, between spatially separated buried impurity zones 192 of the first conductivity type forming cathode regions and a common main impurity zone 191 of the second conductivity type forming a common anode region. The main impurity zone 191 may have a uniform impurity concentration in the range from $5 \times 10^{12}$ to $5 \times 10^{18}$ cm$^{-3}$. A heavily doped contact zone 198 may be formed between the main impurity zone 191 and a rear electrode structure 320. The main impurity zones 191 and the contact layer 198 may form a planar interface parallel to the first and second surfaces 101, 102.

Connection channels 170 extend between the first surface 101 and the buried impurity zones 192, wherein an insulating portion 178 dielectrically insulates a conductive core portion 172 from at least sections of the first semiconductor layer 180. The insulating portion 178 insulates the conductive core portion 172 at least from the drift layer 120. In addition the insulating portion 178 may insulate the core portion 172 from sections of the second semiconductor layer 190. Alternatively or in addition, the insulating portion 178 may insulate the core portion 172 from the separation layer 185. Alternatively or in addition, the insulating portion 178 may dielectrically insulate the conductive core portion 172 from the body zones 115. Alternatively or in addition, the insulating portion 178 may dielectrically separate the conductive core portion 172 from heavily doped contact zones 117 or from the source zones 110. A width of the connection channels 170 may be between 0.5 and 10 μm, for example in a range from 1000 to 5000 μm.

The core portion 172 may be provided from one or more conductive materials. According to an embodiment, the core portion 172 may be a homogenous structure provided from a conductive material, for example heavily doped polycrystalline silicon, a metal, a metal compound, e.g. a metal silicide, or may have a layered structure including one or more layers comprising one or more metals as main constituent(s) and a heavily doped portion of a semiconductor material.

The insulating portions 178 may be provided from one or more dielectric layers including, for example, one or more silicon oxide layers, silicon oxynitride layers, silicon nitride layers, by way of example.

A first electrode structure 311 may be electrically connected through first contact plugs 305 with the source zones 110. The first contact plugs 305 may directly adjoin the first surface 101 or may extend into the semiconductor portion 100. The first contact plugs 305 are electrically connected to the body zones 115 through heavily doped contact zones 117 of the second conductivity type, by way of example.

In addition, the first electrode structure 311 is electrically connected through second contact plugs 306 with the core portions 172. Pairs of first and second contact plugs 305, 306 may be merged into one contact plug, respectively. The first electrode structure 311 may embody or may be electrically connected with the first load terminal LD1 of FIG. 1A.

Second electrode structures 312 may be electrically connected through third contact plugs 307 with the drain zones 130. The first, second and third contact plugs 305, 306, 307 extend through openings of a dielectric structure 220 dielectrically separating the gate electrode 350 from the first and second electrode structures 311, 312.

The dielectric structure 220 may be a single layer of a layered structure including two or more layers of different dielectric materials, for example TEOS oxide, BSG (boron silicate glass), PSG (phosphorus silicate glass), BPSG (boron phosphorus silicate glass) or polyimide, respectively.

Each of the first and second electrode structures 311, 312 and the rear electrode structure 320 may consist of or contain, as main constituent(s) aluminum Al, copper Cu, or alloys of aluminum or copper, for example AlSi, AlCu or AlSiCu. According to other embodiments, one, two or all of the first and second electrode structures 311, 312 and rear electrode structures 320 may contain one or more layers with nickel Ni, titanium Ti, silver Ag, gold Au, platinum Pt, tungsten W and/or palladium Pd as main constituent(s). For example, at least one of the first and second electrode structures 311, 312 or the rear electrode structure 320 includes two or more sub-layers, at least one of the sub-layers containing one or more of Ni, Ti, Ag, Au, Pt, W and Pd as main constituent(s), e.g. a silicide, a nitride and/or an alloy.

The separation layer 185 may be a heavily doped single crystalline semiconductor layer. According to the illustrated embodiment, the separation layer 185 is a heavily doped buried single crystalline semiconductor layer of the second conductivity type, which is the conductivity type of the main impurity zone 191.

The higher the impurity concentration in the separation layer 185 and the greater the distance between the drift layer 120 and the buried impurity zones 192, the smaller the gain of a parasitic bipolar npn transistor T1 formed between the buried impurity zones 192 and the drain zones 130. The mean net impurity concentration in the separation layer 185 may be between $10^{17}$ cm$^{-3}$ and $5\times10^{20}$ cm$^{-3}$, for example approximately $10^{19}$ cm$^{-3}$. A width of the separation layer 185 may be between 1 μm and 15 μm, for example approximately 5 μm.

A parasitic diode D1 is formed between the rear electrode structure 320 and the second electrode structure 312 on the main side. A breakdown voltage of the parasitic diode D1 may be adjusted to be below a breakdown voltage of the rectifier cells 591 and below a breakdown voltage of the pn junctions between the drain zones 130 and the body zones 115 such that in case of a surge at the battery voltage the parasitic diode D1 accommodates the surge current and protects both the rectifier cells 591 and the pn junctions between the drain and body zones 130, 115 against an overcurrent condition. As a consequence, neither the rectifier cells 591 nor the pn junctions between the drain and body zones 130, 115 have to be designed robust for the breakdown condition. Design parameters can be relaxed and a further improvement of other device parameters is possible.

Figure 5B:
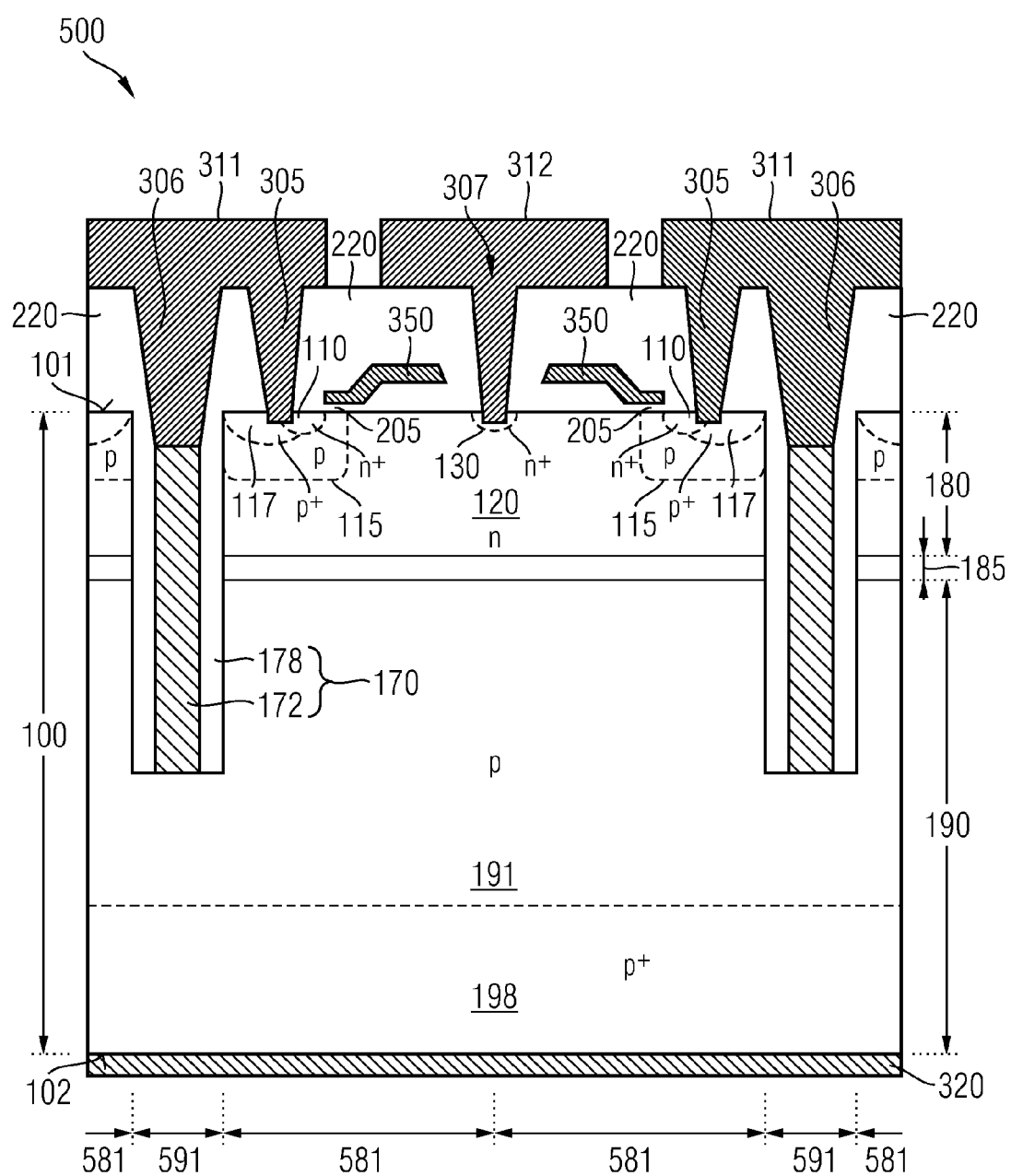
FIG. 5B is a schematic cross-sectional view of a portion of a semiconductor device according to an embodiment providing lateral n-FET cells and rectifier cells based on Schottky junctions.
Figure 5C:
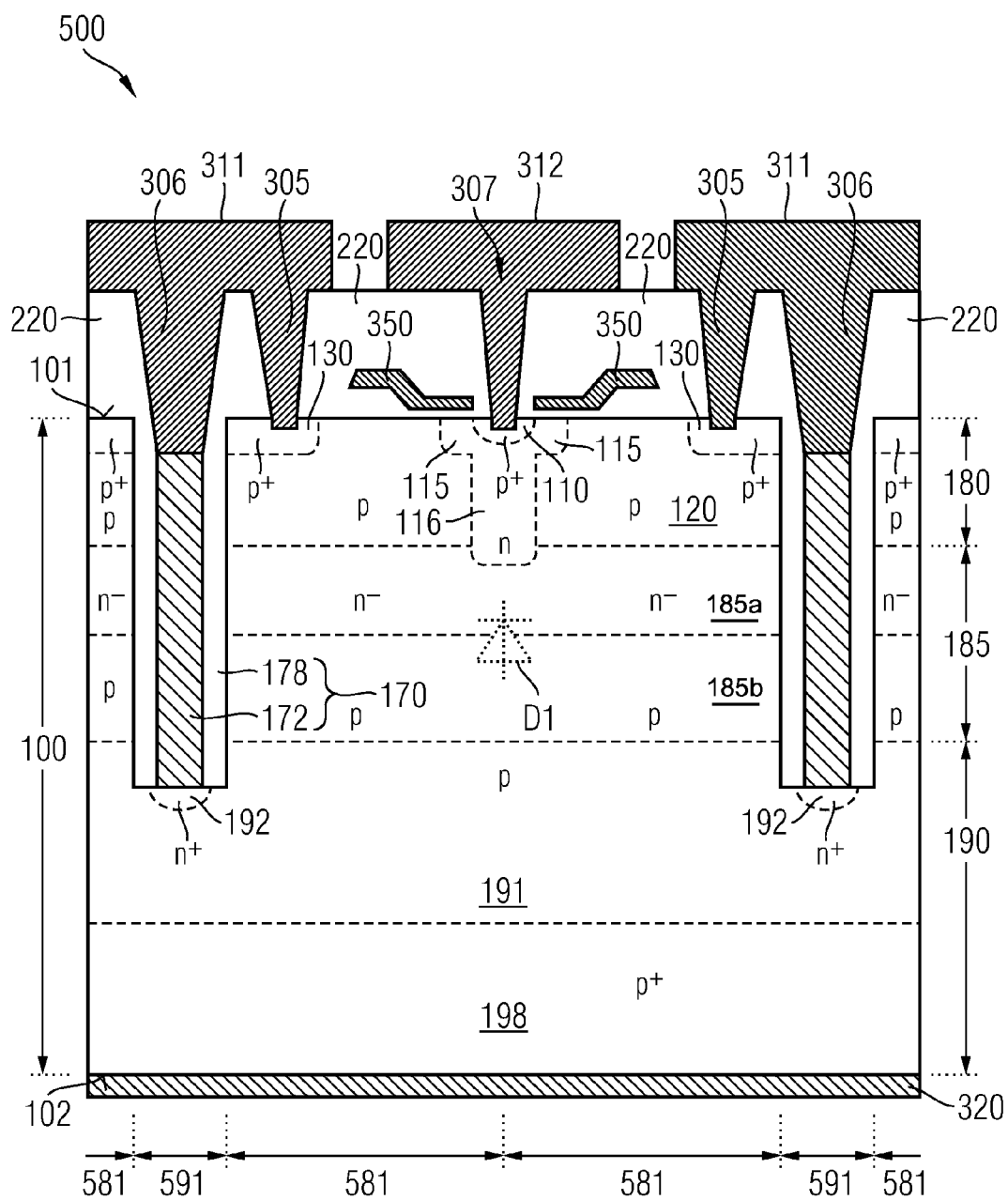
FIG. 5C is a schematic cross-sectional view of a portion of a semiconductor device according to an embodiment providing lateral p-FET cells and rectifier cells based on pn junctions.

The semiconductor device 500 of FIG. 5B differs from the semiconductor device 500 of FIG. 5A in that the core portions 172 directly adjoin the main impurity zone 191 such that the rectifier cells 591 are based on Schottky junctions between the core portions 172 and the main impurity zone 191. The first and second contact plugs 305 and 306 are provided as spatially separated contact plugs separated by portions of the dielectric structure 220. The separation layer 185 is a buried dielectric layer, for example a semiconductor oxide layer. Both the formation of Schottky junctions and the dielectric separation layer 185 avoid formation of a parasitic bipolar transistor between the core portions 172 and the drain zones 130. In addition the separation layer 185 suppresses formation of a parasitic diode D1 between the rear electrode structure 320 and the drain zones 130.

Where the semiconductor devices 500 of FIGS. 5A and 5B refer to switching cells based on lateral n-IGFET cells, the semiconductor device 500 of FIG. 5C provides p-IGFET cells.

The semiconductor device 500, for example a power switching device, includes a semiconductor portion 100 with a first semiconductor layer 180 and a second semiconductor layer 190 oriented parallel to the first semiconductor layer 180. The first semiconductor layer 180 forms a first surface 101 at a wiring side of the semiconductor portion 100. The second semiconductor layer 190 forms a second surface 102 of the semiconductor portion 100 on an opposite rear side, wherein the first and second surfaces 101, 102 are parallel to each other. Each of the first and second semiconductor layers 180, 190 is based on a single-crystalline semiconductor material, for example silicon (Si), silicon carbide (SiC), germanium (Ge), a silicon germanium crystal (SiGe), gallium nitride (GaN) or gallium arsenide (GaAs). The first and second semiconductor layers 180, 190 may be based on the same single-crystalline semiconductor material or may be based on different single-crystalline semiconductor materials.

A distance between the first and second surfaces 101, 102 may be at least 40 μm, for example at least 175 μm. The semiconductor portion 100 may have a rectangular shape with an edge length in the range of several millimeters or a circular shape with a diameter of several millimeters. A normal to the first and second surfaces 101, 102 defines a vertical direction and directions orthogonal to the normal direction are lateral directions.

The switching cells 581 share at least a common p-type source zone 110. The common source zone 110 may be formed as a well in the first semiconductor layer 180 and may directly adjoin the first surface 101. The common source zone 110 may be formed in an n-type body zone 115 directly adjoining the first surface 101 in a portion, where a gate dielectric 205 separates a conductive gate electrode 350 from the semiconductor portion 100.

The common source zone 110 may be patterned along a direction perpendicular to the cross-sectional plane such that n-type contact zones directly adjoining the first surface 101 may provide an electrical connection of the body zones 115. A plurality of spatially separated source zones 110 extend along the lateral direction orthogonal to the cross-sectional plane. An n-type separation zone 116 extending between the body zone 115 and an n-type pedestal layer 185a separates portions of the p-type drift layer 120 assigned to the switching cells 581 sharing the corresponding common source zone 110.

Pairs of the switching cells 581 may be symmetric with regard to a lateral center axis of the common source zone 110 perpendicular to the cross-sectional plane. At a distance to the common source zone 110 p-type drain zones 130 may directly adjoin the first surface 101, wherein the drain zones 130 may be formed as wells extending from the first surface 101 into the drift layer 120.

The n-type pedestal layer 185a forms a first portion of a separation layer 185, wherein the separation layer 185 separates the first and second semiconductor layers 180, 190 and includes a p-type buried layer 185b. The n-type pedestal layer 185a and the p-type buried layer 185b form a parasitic diode D1 which may be designed to have a breakdown voltage lower than the switching cells 581 and the rectifier cells 591.

The separation zone 116 may separate portions of the drift layer 120 assigned to a pair of switching cells 581 formed symmetric to the center axis of the common source zone 110. As regards the impurity concentrations in the impurity zones and layers, the materials of a gate dielectric 205 dielectrically insulating the body zones 115 from conductive gate electrodes 350, the connection channels 170, and the second semiconductor layer 190 reference is made to the description of FIG. 5A.

A first electrode structure 311 may be electrically connected through first contact plugs 305 with the drain zones 130. The first contact plugs 305 may directly adjoin the first surface 101 or may extend into the semiconductor portion 100. In addition, the first electrode structure 311 is electrically connected through second contact plugs 306 with the core portions 172 of the connection channels 170. Pairs of first and second contact plugs 305, 306 may be merged into one single contact plug, respectively. The first electrode structure 311 may embody or may be electrically connected or coupled to the first load terminal LD1 of FIG. 1A.

A second electrode structure 312 may be electrically connected through third contact plugs 307 with the common source zones 110. The third contact plugs 307 may also be electrically connected to the body zones 115 through heavily doped contact zones which may directly adjoin the first surface 101 in a direction perpendicular to the cross-sectional plane, by way of example. The first, second and third contact plugs 305, 306, 307 extend through openings of a dielectric structure 220 dielectrically separating the gate electrode 350 from the first and second electrode structures 311, 312. As regards structure and materials of the dielectric structure 220 and the first and second electrode structures 311, 312 reference is made to the description of FIG. 5A.

The embodiments of FIGS. 5A, 5B and 5C provide a cell area with all switching cells 581 electrically arranged in parallel and all rectifier cells 591 electrically arranged in parallel.

Figure 6A:
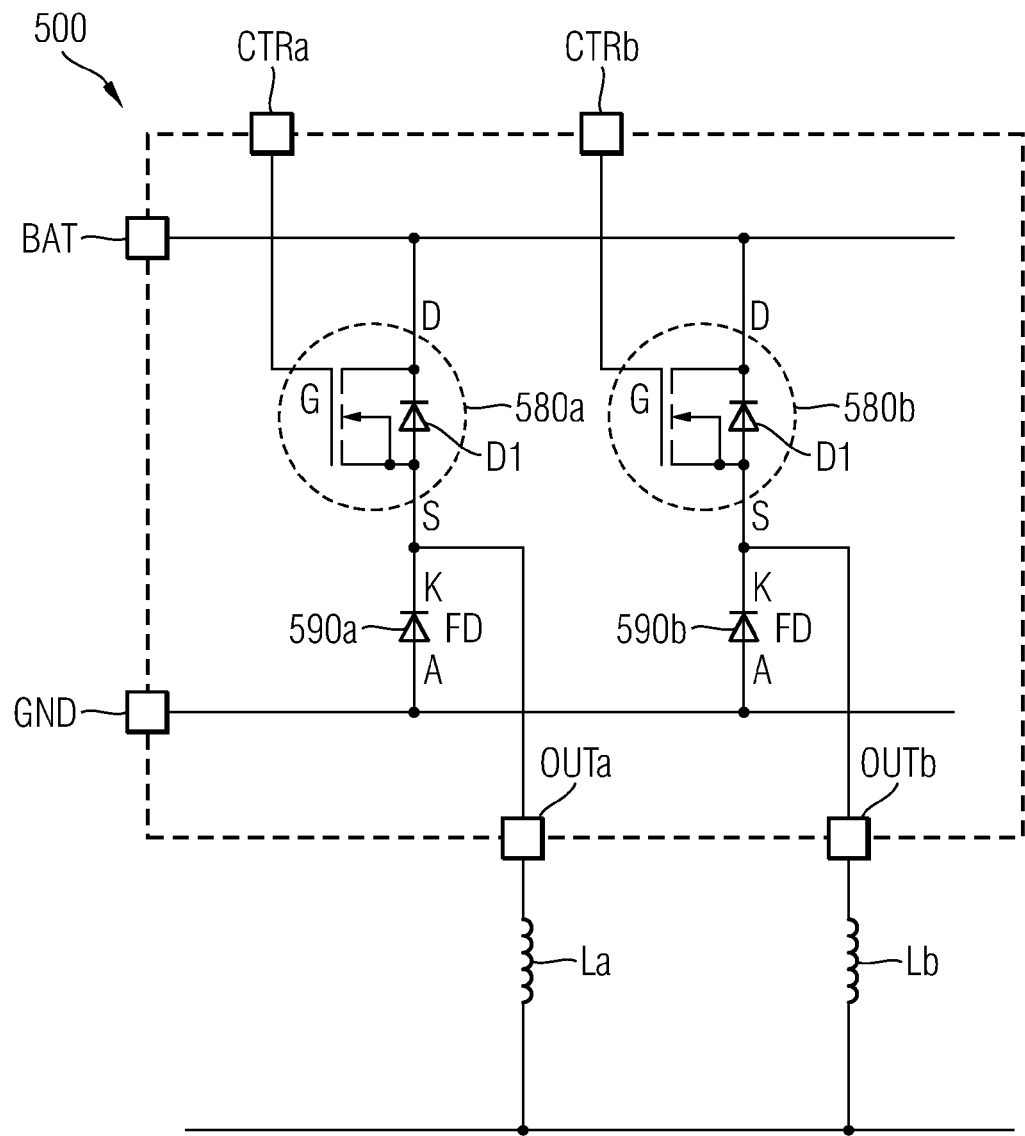
FIG. 6A is a schematic circuit diagram of a switching device in accordance with an embodiment based on n-FET cells and providing more than one load path.
Figure 6B:
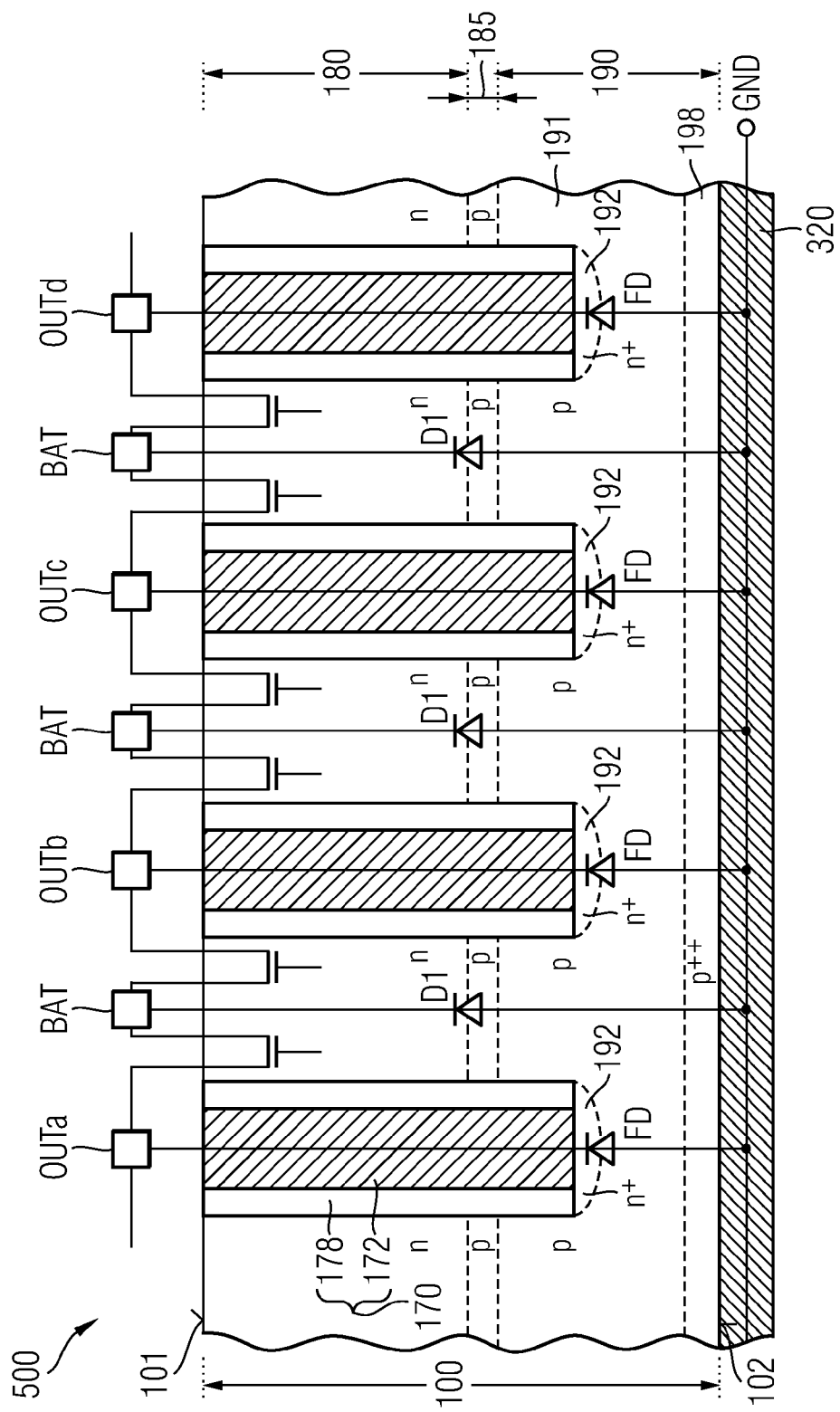
FIG. 6B is a schematic cross-sectional view of a portion of the semiconductor device of FIG. 6A.

FIGS. 6A and 6B refer to embodiments related to semiconductor switching devices providing at least first and second switching cells 581a, 581b of a first and a second switching element 580a, 580b with different first load terminals OUTa, OUTb for switching different inductive loads La, Lb. The first and second switching elements 580a, 580b may be controlled via separate control terminals CTRa, CTRb, such that the first and second switching elements 580a, 580b switch independently from each other. The first and second switching elements 580a, 580b share a second load terminal LD2, for example a common positive voltage source BAR and an auxiliary terminal, for example a common negative voltage source GND. The first and second switching cells 581a, 581b may be dispersed among each or may be grouped in groups of first switching cells 581a and in groups of second switching cells 581b. First rectifier cells 591a may be interspersed among first switching cells 581a and second rectifier cells 591b may be interspersed among second switching cells 581b. The semiconductor device 500 may include further switching cells 581c, 581d and further rectifier cells 591c, 591d for further switching and rectifier elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor switching element comprising a plurality of switching cells connected in parallel between a first and a second load terminal and formed in a cell area of a first semiconductor layer; and
   a rectifier element comprising a plurality of rectifier cells connected in parallel between the first load terminal and an auxiliary terminal and formed in a vertical projection of the cell area in a second semiconductor layer parallel to the first semiconductor layer.

2. The semiconductor device according to claim 1, further comprising:
   a separation layer separating the first and second semiconductor layers.

3. The semiconductor device according to claim 2, wherein the separation layer comprises a semiconductor layer.

4. The semiconductor device according to claim 2, wherein the separation layer comprises a dielectric layer.

5. The semiconductor device according to claim 1, wherein the rectifier cells are interspersed among the switching cells.

6. The semiconductor device according to claim 1, wherein the rectifier and switching cells are arranged alternately along a lateral direction perpendicular to the vertical direction, with m rectifier cells for each n switching cells and m and n being natural numbers greater than zero.

7. The semiconductor device according to claim 1, further comprising:
   connection channels extending from a first surface of the first semiconductor layer through the first semiconductor layer into the second semiconductor layer, each connection channel comprising a conductive core portion and an insulating portion dielectrically separating the conductive core portion from at least sections of the first semiconductor layer in lateral directions perpendicular to the vertical direction.

8. The semiconductor device according to claim 7, wherein the second semiconductor layer includes a main impurity zone.

9. The semiconductor device according to claim 8, wherein the core portions and the main impurity zone form Schottky junctions.

10. The semiconductor device according to claim 8, further comprising:
buried implant zones directly adjoining the core portions at buried face ends of the core portions, wherein each buried implant zone forms a pn junction with the main impurity zone.

11. The semiconductor device according to claim 10, wherein
portions of the main impurity zone spatially separate the buried implant zones from each other.

12. The semiconductor device according to claim 1, further comprising:
a first contact structure assigned to the first load terminal and a second contact structure assigned to the second load terminal, the first and second contact structures provided at the same side of the semiconductor device.

13. The semiconductor device according to claim 8, further comprising:
a rear electrode structure adjoining the second semiconductor layer at a second surface opposite to the first surface and electrically connected to the main impurity zone and the auxiliary terminal.

14. The semiconductor device according to claim 1, wherein:
the switching cells are n-IGFET cells comprising source zones of a first conductivity type electrically connected to the first load terminal and drain zones of the first conductivity type electrically connected to the second load terminal; and
the rectifier cells comprise cathode electrode structures electrically connected with the source zones.

15. The semiconductor device according to claim 14, wherein:
connection channels extend from a first surface of the first semiconductor layer through the first semiconductor layer into the second semiconductor layer; and
each connection channel comprises a conductive core portion and an insulating portion dielectrically separating the conductive core portion from at least sections of the first semiconductor layer in lateral directions perpendicular to the vertical direction, the conductive core portion forming a portion of the cathode electrode structure.

16. The semiconductor device according to claim 1, wherein:
the switching cells are n-IGFET cells comprising source zones of a first conductivity type electrically connected to the second load terminal and drain zones of the first conductivity type electrically connected to the first load terminal; and
the rectifier cells comprise anode electrode structures electrically connected to the drain zones.

17. The semiconductor device according to claim 16, wherein:
connection channels extend from a first surface of the first semiconductor layer through the first semiconductor layer into the second semiconductor layer, and
each connection channel comprises a conductive core portion and an insulating portion dielectrically separating the conductive core portion from at least sections of the first semiconductor layer in lateral directions perpendicular to the vertical direction, the conductive core portion forming a portion of the anode electrode structure.

18. The semiconductor device according to claim 1, wherein:
the switching cells are p-IGFET cells comprising drain zones of a second conductivity type electrically connected to the first load terminal and source zones of the second conductivity type electrically connected to the second load terminal; and
the rectifier cells comprise cathode electrode structures electrically connected with the drain zones.

19. The semiconductor device according to claim 18, wherein:
connection channels extend from a first surface of the first semiconductor layer through the first semiconductor layer into the second semiconductor layer, and
each connection channel comprises a conductive core portion and an insulating portion dielectrically separating the conductive core portion from at least sections of the first semiconductor layer in lateral directions perpendicular to the vertical direction, the conductive core portion forming a portion of the cathode electrode structure.

* * * * *